United States Patent [19]
White

[11] Patent Number: 5,530,280
[45] Date of Patent: Jun. 25, 1996

[54] PROCESS FOR PRODUCING CRACKSTOPS ON SEMICONDUCTOR DEVICES AND DEVICES CONTAINING THE CRACKSTOPS

[75] Inventor: Eric J. White, Essex Junction, Vt.

[73] Assignee: International Business Machines Corporation, Armonk, N.Y.

[21] Appl. No.: 414,889

[22] Filed: Mar. 31, 1995

Related U.S. Application Data

[62] Division of Ser. No. 998,163, Dec. 29, 1992.

[51] Int. Cl.⁶ .................. H01L 21/265; H01L 21/308
[52] U.S. Cl. .............................. 257/508; 257/522
[58] Field of Search ....................... 257/506, 508, 257/522; 427/85; 156/277; 437/227, 228, 226

[56] References Cited

U.S. PATENT DOCUMENTS

| | | | |
|---|---|---|---|
| 4,228,581 | 10/1980 | Chadda et al. | 29/578 |
| 4,356,211 | 10/1982 | Riseman | 427/85 |
| 4,922,326 | 12/1990 | Blumenshine et al. | 357/80 |
| 4,976,814 | 5/1990 | Blumenshine et al. | 156/277 |
| 5,017,512 | 5/1991 | Takagi | 437/227 |
| 5,024,970 | 6/1991 | Mori | 437/226 |
| 5,096,855 | 3/1992 | Vokoun, III | 437/227 |
| 5,136,354 | 8/1992 | Morita et al. | 357/40 |
| 5,157,001 | 10/1992 | Sakuma | 437/227 |
| 5,227,658 | 7/1993 | Beyer et al. | 257/522 |
| 5,283,461 | 2/1994 | Beasom | 257/508 |

FOREIGN PATENT DOCUMENTS

| | | | |
|---|---|---|---|
| 0220404 | 10/1986 | European Pat. Off. | 257/508 |
| 8908793 | 10/1989 | France | 257/508 |

OTHER PUBLICATIONS

"Polymide or KTFR in Kerf During Dicing/Chip Sawing" *IBM Technical Disclosure Bulletin*, 27 (4A), 1962–1963 (Sep. 1994).

"Method of Preventing Damage to Integrated Circuit Chips During Wafer Dicing" *IBM Technical Disclosure Bulletin*, 34 (12), 311–312 (May, 1992).

*Primary Examiner*—Donald L. Monin, Jr.
*Attorney, Agent, or Firm*—Heslin & Rothenberg

[57] ABSTRACT

A process for making a crackstop on a semiconductor device is disclosed. The process involves creating and metallizing a groove surrounding the active region on a chip at the same time as other functional metallization is occurring, and then selectively etching out the metal in the groove after final passivation. In various embodiments the groove passes through the surface dielectric or the semiconductor substrate. In one embodiment the groove is replaced by hollow metal rings that can be stacked through multiple dielectric layers.

3 Claims, 7 Drawing Sheets

PROCESS FOR PRODUCING CRACKSTOPS ON SEMICONDUCTOR DEVICES AND DEVICES CONTAINING THE CRACKSTOPS

This application is a division of application Ser. No. 07/998,163, filed Dec. 29, 1992.

FIELD OF THE INVENTION

The invention relates to a process for making a crackstop on a semiconductor device and to semiconductor devices incorporating these crackstops.

BACKGROUND OF THE INVENTION

In the manufacture of semiconductor devices, a plurality of integrated circuits are simultaneously prepared in a semiconductor wafer through the use of conventional photolithographic techniques. Thus, for example, a wafer may contain multiple separate integrated circuits which have been formed on the substantially planar surface area of the wafer according to conventional techniques in the art as, for example, by diffusing or otherwise forming predetermined patterns in a silicon body. It is also convenient to provide a plurality of secondary devices such as contact pads, test monitor devices, and devices for measurement and alignment on the planar surface adjacent the outer perimeter of each integrated circuit or other semiconductor device. Each single integrated circuit is of relatively minute dimensions so that it is convenient to simultaneously form a plurality of them in a single wafer while marking the boundaries between the individual devices along perpendicular axes referred to as dicing lines or lanes. Dicing lines are formed spaced apart in two directions crossing at right angles on a wafer. Generally, the width of the dicing line is 50–100 µm and the depth is 3–10 µm. Since the dicing area is a region cut by a metal rotary blade, an element of an IC (hereinafter referred to as a function element) is not formed in this region, but a test element for testing the function element or an alignment mark for mask alignment is often formed there.

In accordance with techniques well known in the art, after a semiconductor wafer has been formed into interconnected semiconductor devices, the chips are tested to identify those which are satisfactory and those improperly formed or malfunctioning and unsatisfactory. As mentioned earlier, it is common practice to put test, measurement, alignment and die seal structures in the dicing lanes. After testing, adjacent satisfactory chips are left joined together while unsatisfactory chips are separated or the entire wafer is separated and the unsatisfactory chips are discarded. Separation (or dicing) may be performed by conventional techniques such as sawing or laser cutting along the dicing lane.

One of the greatest problems of large scale integration is that of obtaining a high enough yield of devices from each wafer to be commercially profitable. As the number and complexity of devices per wafer increases, the yield often decreases proportionally. It is therefore highly desirable to minimize the number of devices that must be discarded as unsatisfactory.

Semiconductor devices commonly include one or more layers of dielectric material. Generally, the dielectric layers are fabricated in a predetermined manner so that metal interconnect lines may be formed thereon. Tungsten or aluminum alloys and other like metals are commonly used to form the interconnect lines. IC chips having multiple bonded dielectric layers as well as multiple layers of interconnect lines disposed thereon are known in the art.

Often the density of dielectric material is not uniform throughout. Film stresses and interfaces in the material allow microcracks to propagate within the dielectric until they encounter metal such as that used in interconnect lines and vias. Because metal lines are very thin, the crack will sever the line, causing chip failure.

The dicing operation often induces microcracks in both the semiconductor substrate and the dielectric layers on top. Microcracks occurring in silicon substrates propagate very rapidly and tend to lead to failures that show up in the initial testing described above. Microcracks in dielectric layers propagate more slowly and tend to lead to delayed failures—often after the device is in the field. Failures in the field are particularly expensive and disruptive. Therefore, processes that reduce microcrack propagation in dielectric layers are highly desirable.

One approach to the problem is that offered by the technique of Blumenshine et al. (U.S. Pat. Nos. 4,992,326 and 4,976,814). In this approach, metal crack arrestor patterns are formed in the corners of the package, where stresses and failures are said to be highest. The technique, however, requires the deposition of fairly substantial layers, because layers of the thickness of a typical metallization will not stop a microcrack; rather, the metal strap will fracture. Moreover, cracks originating elsewhere than at corners will propagate unimpeded. Thus corner bracing is alleged to decrease damage from chipping and thermal shock that the chip may sustain during transportation and use, but would not be expected to prevent damage arising from the dicing procedure.

Mori (U.S. Pat. No. 5,024,970) describes a process for producing a pair of grooves in the silicon substrate inboard of the dicing lane to act as crack arrestors. The grooves are produced by sintering a platinum film to form platinum silicide which acts as an etch mask for creating the pair of grooves, one on each side of the silicide. The process of Mori produces grooves in silicon, but not dielectric, and requires a number of steps (deposition, sintering and etching) in addition to those necessary for the formation of the active device region. The term "active device region" as used herein describes a construction related to the operation of the electronic element. It includes such structures as p/n junctions, MOSFETS, etc.

There is thus a need for a process for creating a crackstop, particularly in dielectric layers, which process requires no additional mask steps and only one or two additional processing steps beyond those involved in the creation of active regions.

SUMMARY OF THE INVENTION

It is an object of the present invention to provide a structure to arrest the propagation of microcracks in dielectric layers and semiconductor substrates.

It is a further object to provide a process for creating a crackstop, which process requires no additional mask steps and only one or two additional processing steps beyond those required for the creation of active regions.

It is a particular advantage of the process of the invention that the patterning and deposition of metal for contacts and for the process of creating crackstops can be carried out simultaneously so that only one mask step and only one deposition step are required.

These and other objects, features and advantages are provided by the present invention which relates to a method for forming crackstops in a semiconductor device comprising the steps of:

(a) depositing a dielectric material on a semiconductor substrate having a plurality of active and inactive regions;

(b) patterning the dielectric material with vias in the active regions and with grooves in the inactive regions, each groove forming a continuous loop surrounding one of the active regions; and (c) depositing a first metal in both the vias and the grooves to create a plurality of contacts and a plurality of metal rings.

The method may be further refined by:

(d) creating a layer of a second metal over the contacts, said second metal chosen such that the first metal may be selectively etched in the presence of the second; and (e) removing the first metal from the groove.

By selectively etched is meant that the etch rate ratio between the second metal and the first metal is high enough to allow the removal of substantially all of the first without impairing the function of the second.

In a preferred embodiment the first metal is tungsten or a tungsten alloy and the second metal is aluminum or an aluminum alloy. The grooves are created parallel to and in proximity to a series of dicing lines whereby a chip created by severing the substrate along the dicing lines will possess a continuous groove around the periphery of an active device region. The groove may extend in depth about to the substrate.

In a second aspect the invention relates to a method for forming crackstops in a semiconductor device comprising the steps of:

(a) depositing a first dielectric material on a semiconductor substrate;

(b) patterning the dielectric material with a plurality of grooves extending in depth about to the substrate. Each groove forms a continuous loop surrounding one of a plurality of active device regions, whereby a chip created by severing the substrate will possess a continuous groove around the periphery of an active device region;

(c) depositing tungsten in the grooves; and (d) removing the tungsten.

The advantages of the method are maximized when the patterning of the dielectric with a series of grooves is carried out simultaneously with a patterning of the dielectric for metallic structures in the active device regions.

In one embodiment, the continuous groove extends down to a boundary between the substrate and the dielectric material. In another embodiment the continuous groove penetrates into the substrate. To selectively dissolve tungsten, a peroxide solution may be used, preferably the peroxide solution is a 10 to 30% aqueous solution of $H_2O_2$ at from 60° to 100° C. Additional processing of the device may be carried out between step (c) and step (d). The processing will often comprise depositing and patterning a non-tungsten metallization layer and depositing and patterning a passivation film.

In most embodiments the tungsten is deposited for forming interconnects in an active device region at the same time as it is deposited in the groove.

In another aspect the invention relates to a method for forming crackstops in a semiconductor device having multiple dielectric layers. The method comprises the steps of:

(a) depositing a first dielectric material on a semiconductor substrate;

(b) patterning the dielectric material with a plurality of grooves extending in depth about to the substrate, each groove forming a continuous loop surrounding one of a plurality of active device regions;

(c) depositing tungsten in the grooves;

(d) depositing one or more successive films of dielectric material on the first dielectric, each successive film having a plurality of grooves vertically aligned with the first tungsten-filled grooves and each of the grooves being filled with tungsten; and (e) removing the tungsten from said grooves.

In another aspect the invention relates to a method for forming crackstops in a semiconductor device comprising the steps of:

(a) patterning a semiconductor substrate with a series of grooves, each groove forming a continuous loop surrounding one of a plurality of active regions in the substrate;

(b) conformally depositing a film of a thickness less than ½ the width of the groove, whereby the groove is incompletely filled and a pocket is formed in each continuous loop surrounding an active device region;

(c) depositing tungsten in the pocket to create a tungsten ring; and (d) removing the tungsten.

When the film is a dielectric layer, this creates a plurality of crackstops in the form of dielectric-lined grooves surrounding active device regions.

In a preferred embodiment of this aspect the dielectric layer is provided with a series of vias between steps (b) and (c), and the deposition of tungsten to create the ring simultaneously creates contacts in the vias.

Between step (c) and step (d) the device may be additionally processed by depositing and patterning an aluminum alloy metallization layer and depositing and patterning a passivation film.

In a further embodiment the invention relates to a semiconductor device produced by the foregoing method. The semiconductor device comprises a semiconductor substrate and a dielectric layer. The substrate includes an active device region surrounded by a dielectric-lined groove.

In another aspect, the invention relates to a method for forming crackstops in a semiconductor device comprising the steps of:

(a) depositing a dielectric material on a semiconductor substrate;

(b) patterning the dielectric material with a series of grooves extending in depth about to the substrate, each groove forming a continuous loop surrounding one of a plurality of active device regions;

(c) conformally depositing, preferably by chemical vapor deposition, in the grooves a first metal layer, preferably tungsten, of a thickness less than ½ the width of the groove, whereby the groove is incompletely filled; and (d) depositing a second metal layer, preferably an aluminum alloy, on top of the groove by an orientation-sensitive process, preferably sputtering, whereby a cavity is formed bounded on three sides by the first metal layer and on a fourth side by the second metal layer.

The sequence of steps (a) to (d) (except that the groove in step (b) does not extend below the layer in which it is formed) may be repeated for a series of crackstops in a plurality of layers of dielectric. This will result in each successive film or layer having a plurality of hollow metal rings which are preferably vertically aligned with the first series of grooves whereby a chip created by severing the substrate will possess a crackstop in the form of a stack of hollow metal rings surrounding an active region.

In one embodiment the groove is 2 to 3 μm wide and the tungsten is 0.8 to 1.0 μm thick.

In a further aspect the invention relates to a semiconductor device produced by the foregoing method. The semiconductor device comprises a semiconductor substrate having a plurality of dielectric layers thereon; the substrate includes an active region and each of the dielectric layers contains a continuous hollow metallic loop surrounding the substrate active region. The hollow metallic loops surrounding the active regions are preferably composed of two metal compositions, a first metal composition, preferably tungsten, forming a floor and walls of a cavity and a second metal composition, preferably an aluminum alloy, forming a cap of the cavity.

DETAILED DESCRIPTION OF THE INVENTION

Figure 1:
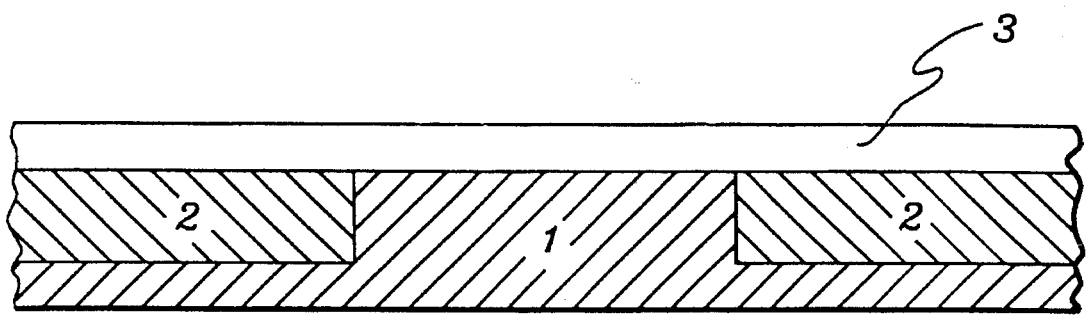
FIGS. 1 through 8 are sequential cross-sections showing the fabrication of a semiconductor device according to a first embodiment of the process of the invention.
Figure 2:
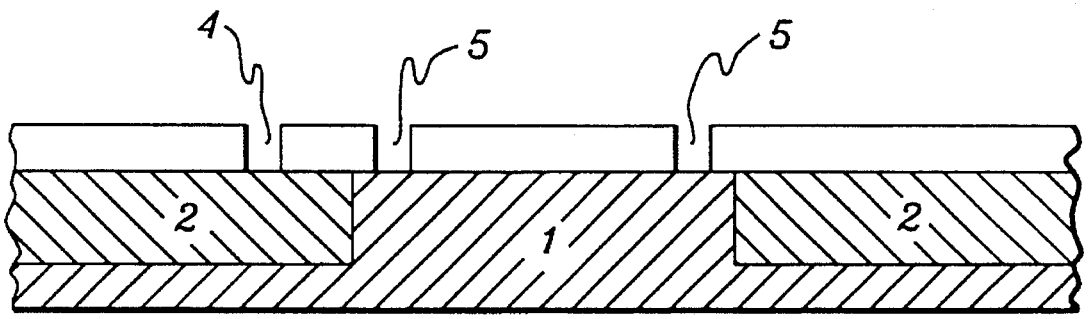

A first process according to the invention is illustrated in cross section in FIGS. 1 through 8. FIG. 1 shows a substrate 1, which in the case of the example is silicon, but may be any semiconductor substrate (for example, gallium arsenide) having therein active device regions 2. The active device regions are formed by processes well known in the art. Each of the active regions 2 includes at least one electronic element. The details of the active region are omitted in the figures. A dielectric layer 3, which can be silicon nitride, silicon dioxide, boron phosphorus silicon glass, aluminum oxide, polyimide or other dielectric material, is deposited on the substrate. A photoresist is laid down on top of the dielectric layer 3 and patterned to provide the vias 4 and the groove 5, which are etched, for example by reactive ion etching (RIE), and the mask is removed to provide the structure shown in FIG. 2. The groove 5 is etched down to the substrate. It is not absolutely necessary to reach the substrate, but the further the bottom of the groove above the substrate the less efficiently it will function as a crackstop. For the purposes of some devices we have found that a residue as much as 2000 Å thick will still provide a workable crackstop.

Figure 3:
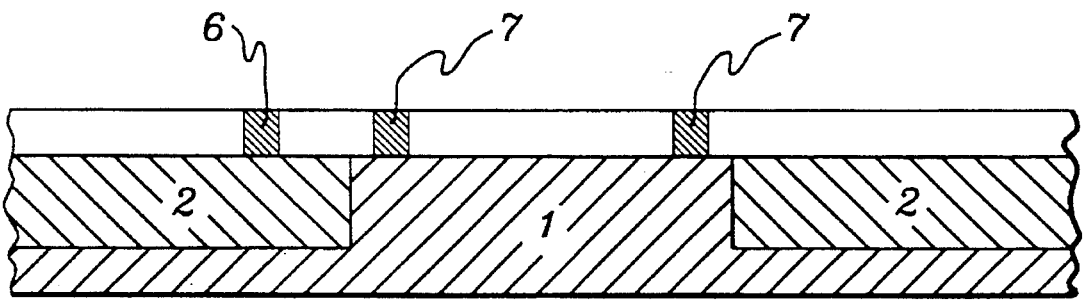
Figure 4:
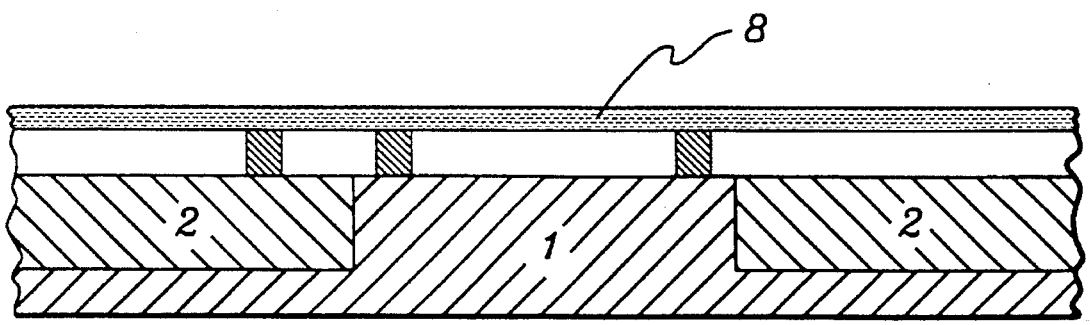
Figure 5:
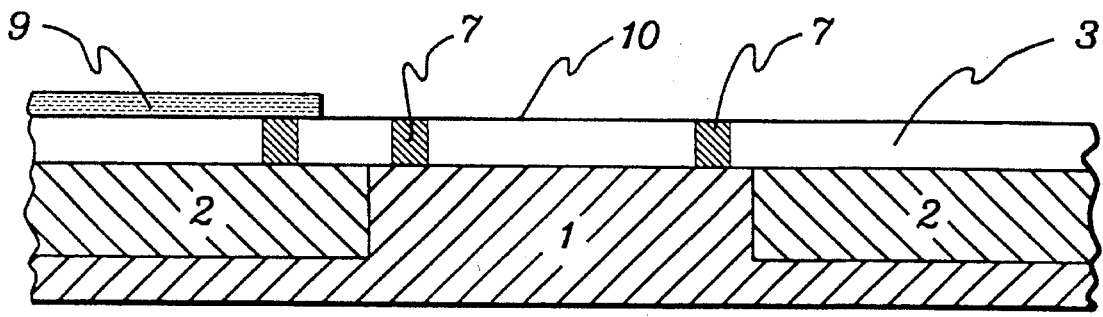

Tungsten is conformally deposited, for example by chemical vapor deposition (CVD), and the surface planarized to provide the structure shown in FIG. 3 having tungsten contacts 6 and tungsten ring 7. Note that the patterning of active structures and of the crackstop and the deposition of active structures and the crackstop may be accomplished in single operations. This is the preferred process, but each of these could be accomplished separately if circumstances required. A layer of aluminum or other metallization 8 is deposited on top of the dielectric providing electrical contact with the tungsten as shown in FIG. 4. Common metallization materials include, in addition to aluminum and its alloys, Ti, Pt, Au, Cr, Mo, Ni, Zr, Pd and alloys thereof. A photoresist is laid down again and patterned to define the interconnects 9, and to clear the surface over the dicing lane 10 and the tungsten ring 7. The aluminum or other metallization is etched from over the dice lane, the grooves and from the appropriate areas within the active region as shown in FIG. 5. This etch is commonly done with a dry etch that stops at the dielectric layer 3. A typical RIE etch for aluminum would be carried out in a $BCl_3$, HCl and $CHCl_3$ ambient.

Figure 6:
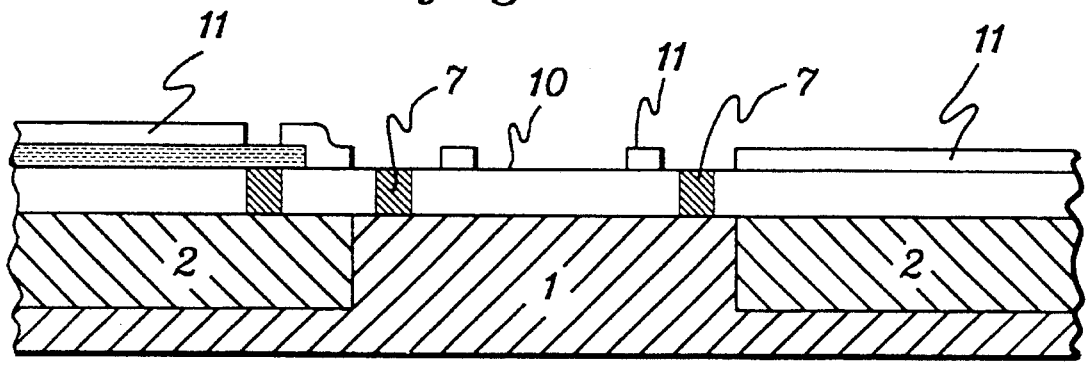
Figure 7:
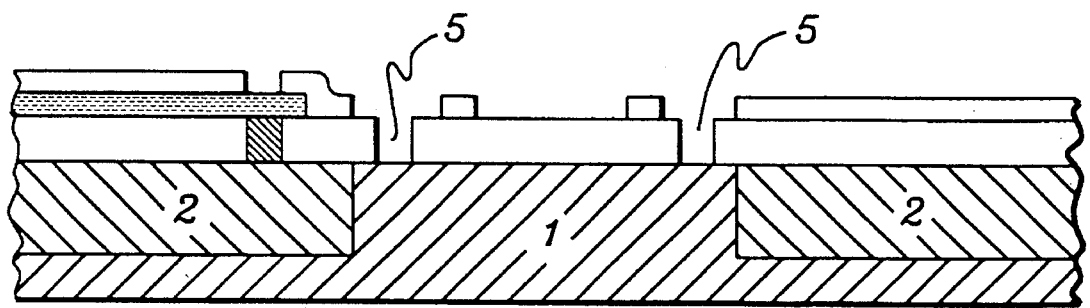
Figure 8:
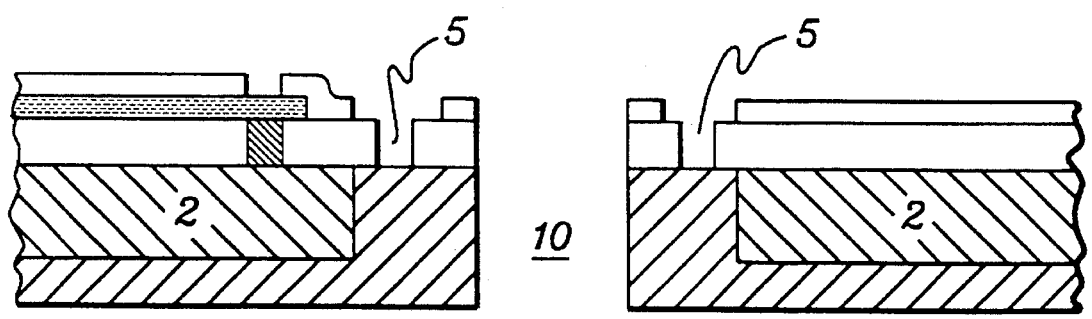
Figure 9:
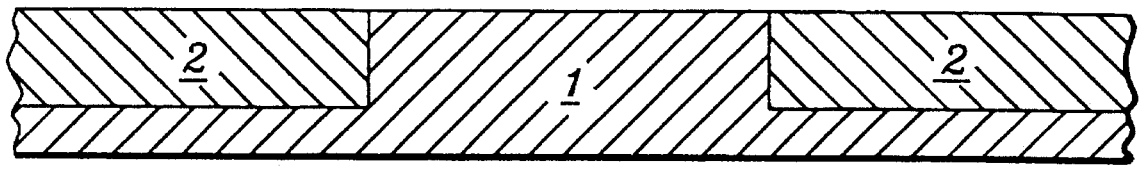
FIGS. 9 through 14 are sequential cross-sections showing the fabrication of a semiconductor device according to a second embodiment of the invention.
Figure 23:
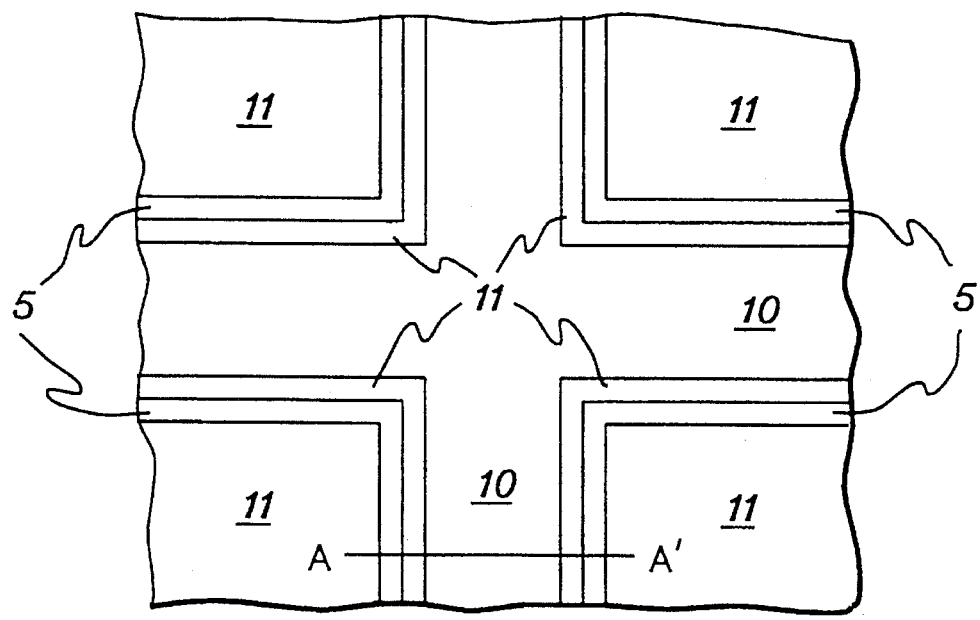
FIG. 23 is a plan view of the intersection of two dice lanes showing the location of the crackstop in respect to the active regions and dice lanes.

A passivation layer 11, commonly silicon nitride or similar material, is deposited over the structure followed by photolithography to define access to the pads 12 and to the ring 7 and to preliminarily etch the dicing lane. The passivation layer 11 is selectively etched down to the metal of the pad or the ring as shown in FIG. 6. The ring is then selectively removed by etching with any etchant that is highly selective for tungsten over aluminum, in this case a hydrogen peroxide etch, to provide the structure shown in FIG. 7. The wafer is then diced through area 10 to provide chips as shown in FIG. 8. FIG. 23 is a plan view at the same stage as FIG. 7 of the intersection of two dice lanes 10, showing the location of the grooves 5 in relation to the active region which is coated with passivation layer 11. For simplicity the pads 12 are not shown in FIG. 23. FIG. 7 is a cross section through FIG. 23 at line A–A'.

The dielectric layer 3 is depicted as a single layer, but it need not be monolithic. It can be a sandwich of multiple dielectrics as long as the whole layer can be etched to provide the via 4 and the groove 5.

In the foregoing example, the ring structure 7 was provided by tungsten and the metallization 8 was an aluminum alloy. This is a convenient and effective combination, but any combination of metals that would provide effective metallization layers and that had a high differential etch rate ratio would function in similar fashion, for example tantalum, titanium and tungsten can be selectively etched in the presence of aluminum, copper and alloys thereof. Similarly, any etchant may be used that distinguishes between the metal in the ring 7 and the metallization 8. Etch rate ratios of 30 or greater are preferred.

When the ring is tungsten and the metallization is aluminum, hot aqueous hydrogen peroxide is a suitable etchant. We have found that 10 to 30% $H_2O_2$ is a convenient reagent, but other than safety considerations there is no reason that concentrations above 30% could not be used. We have found that an optimal temperature range for the $H_2O_2$ etch is 70°–75° C. Below 60° the reaction is impractically slow for a commercial process; above 75° the reaction is faster, but that degree of acceleration is unnecessary for most purposes, and it becomes harder to take full advantage of the selectivity because contact times are so short.

The groove is created as a single ring around the active region of each chip. This is because almost all cracks start on the outside edge of a chip and propagate inward. As discussed above, cracks tend to occur more frequently in the dielectric layer. As the crack propagates inward into the active region it will eventually encounter a metal line. Because the metal lines are very thin, the crack will continue across the metal line, severing the connection and causing failure of the chip. With the groove surrounding the active region, cracks that begin on an edge will terminate at the groove before reaching the active region. For a device of 5×12 mm the groove is about 1 µm wide.

If a tightly adherent solid metal feature were left in the ring, i.e. if the tungsten were not etched out, the considerable energy of the propagating crack tip could pass through the metal ring and continue. If the tungsten were weakly adhered to the dielectric, the crack's energy could be dissipated and propagation halted, but since the ring is being deposited along with the contacts, the contacts would also be weakly adherent.

Figure 24:
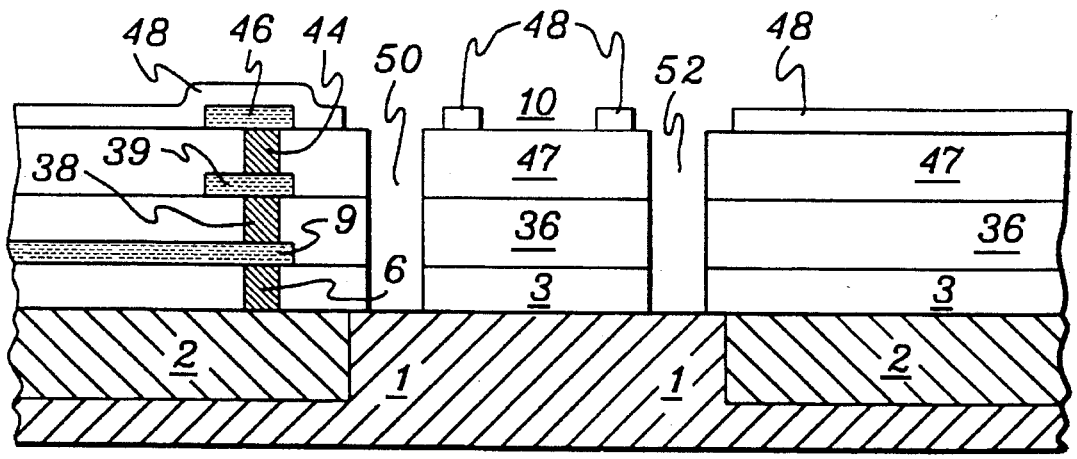
FIG. 24 is a cross section of a first embodiment of the invention having multiple dielectric depositions.

In a further extension of this embodiment, multiple layers of dielectric may be deposited, one on top of the other and the patterning and deposition repeated as before. The grooves for the crackstop must be kept in vertical alignment. FIG. 24 illustrates such a multilayer device. In this case second dielectric layer 36 and third layer 47 have been deposited, patterned and provided with contacts 38 and 44 and interconnects 39 and 46. A final passivation layer 48 has been laid down and grooves 50 and 52 etched through all of the tungsten rings. Because of the aspect ratio and the thickness of tungsten filling the grooves 50 and 52, the etch is more problematic and the device and process of the third embodiment (below) may be preferred in some instances.

Figure 10:
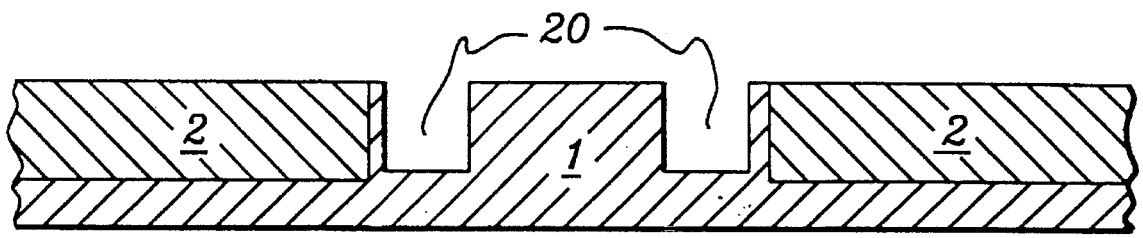
Figure 11:
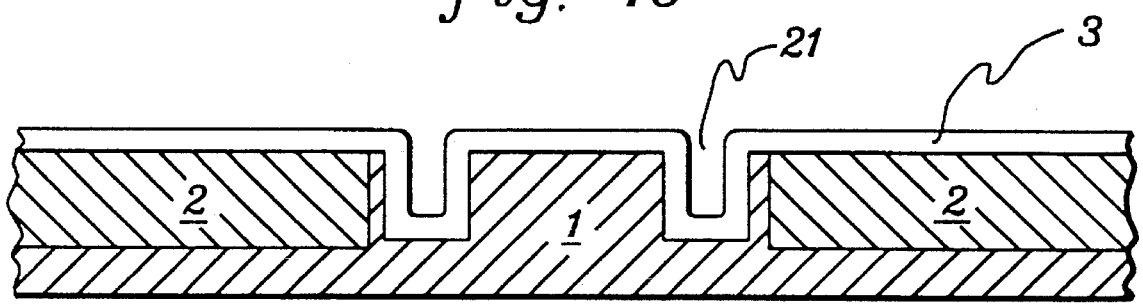
Figure 12:
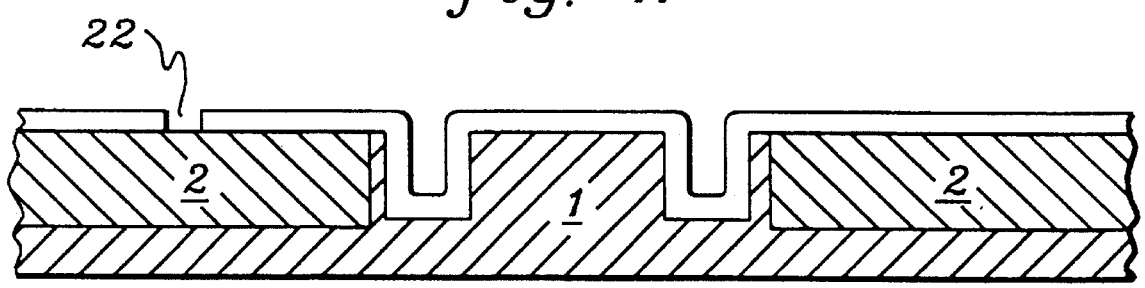
Figure 13:
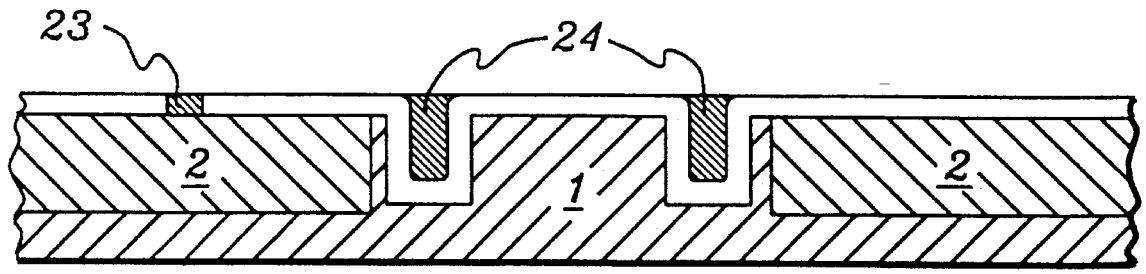
Figure 14:
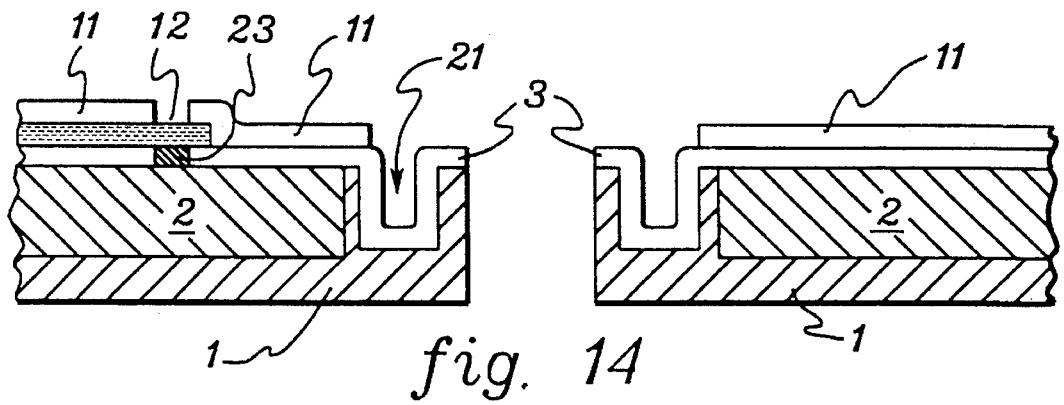

The embodiment discussed above and described in FIGS. 1 to 8 can be modified as shown in FIGS. 9 to 14 if a crackstop for the substrate is needed or if the sequence of dielectric deposition, patterning and metallization needs to be altered for processing reasons. In the embodiment shown in FIGS. 9 to 14 a substrate 1 having therein active device regions 2 as before is first patterned and etched to provide the groove 20 surrounding each active region. The groove 20 in this case shown in FIG. 10 is similar to the groove 5 of the first embodiment (FIG. 2) but differs in that it is cut into the substrate and it is wider. In the first case the groove was narrow enough to be completely filled by the metallization deposition; in this case its width is greater than twice the thickness of the composite of all subsequent film depositions. In principle, the groove can be any width as long as it is more than twice the thickness of subsequent depositions; in practice, grooves more than 3 or 4 times the thickness of subsequent depositions are wasteful of valuable space and would not commonly be used. Typical widths are 3 to 5 µm. This creates a hollow or pocket 21 when the dielectric 3 is laid down as shown in FIG. 11. The dielectric is patterned for the vias 22 as shown in FIG. 12 and tungsten is deposited as before to create both the contacts 23 and the pocket fill 24 as shown in FIG. 13. The rest of the process is the same as for the first embodiment—including the removal of tungsten—and results in a chip that has a dielectric-lined groove 21 surrounding the active region as shown in FIG. 14.

Figure 25:
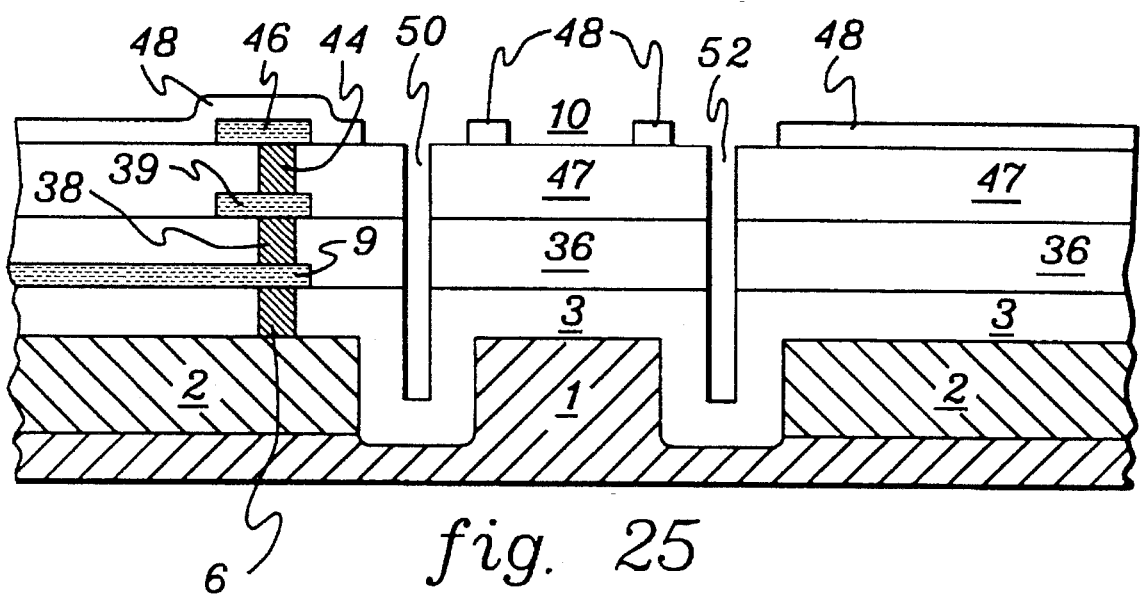
FIG. 25 is a cross section of a second embodiment of the invention having multiple dielectric depositions.

As with the first embodiment of the present invention, a multi-layer version of the crackstop of the second embodiment may be formed, as illustrated in FIG. 25. The process for forming the multi-layer crackstop of the second embodiment commences following completion of the step producing the structure illustrated in FIG. 13. As described above with regard to the multi-layer version of the crackstop of the first embodiment, multiple layers of dielectric may be deposited on top of the first (bottom) dielectric layer, patterned so as to form grooves that are vertically aligned with the tungsten-filled grooves of the first dielectric layer, and then metallized so that the grooves are filled with tungsten. Finally, the tungsten is removed so as to produce the crackstop illustrated in FIG. 25.

Figure 15:
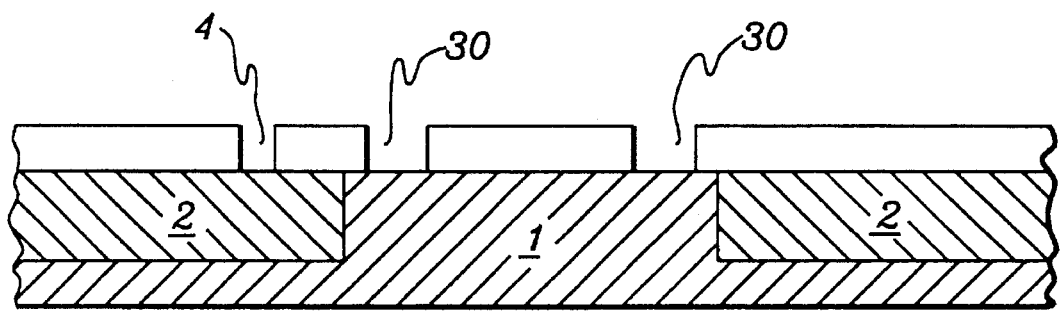
FIGS. 15 through 21 are sequential cross-sections showing the fabrication of a semiconductor device according to a third embodiment of the invention.
Figure 16:
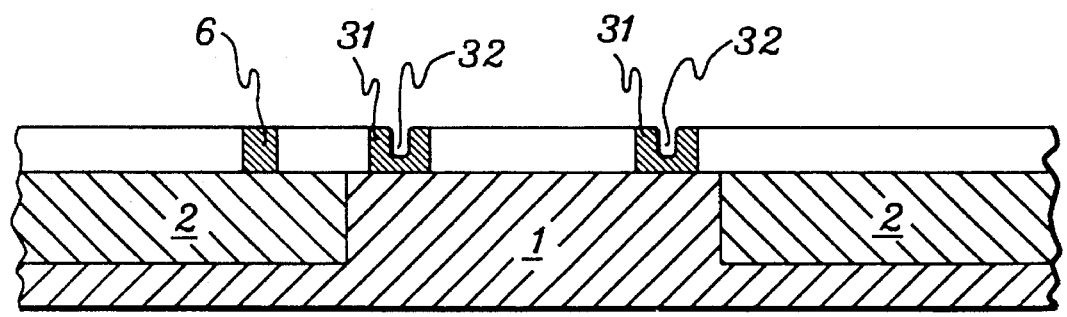

A third embodiment is shown in FIGS. 15 to 22. The third embodiment improves the crackstop technology of the invention for devices having multiple metallurgy levels. Starting as before at FIG. 1 with a substrate 1 having active device regions 2 therein and a dielectric layer 3 on top, the dielectric is patterned as in the first embodiment with the vias 4 and the groove 30 as shown in FIG. 15. In this case the groove 30 has a width whose dimension is 2 to 3 times the thickness of a subsequent metal (tungsten) deposition. Tungsten is conformally deposited to a thickness less than half the width of the groove 30 whereby the groove is incompletely filled. Typically the groove will be $\geq 2$ µm and the tungsten deposition will be $\leq 1$ µm. The surface is planarized back to the dielectric to provide the contacts 6 and the ring 31 which now contains a pocket or hollow 32 as shown in FIG. 16.

Figure 17:
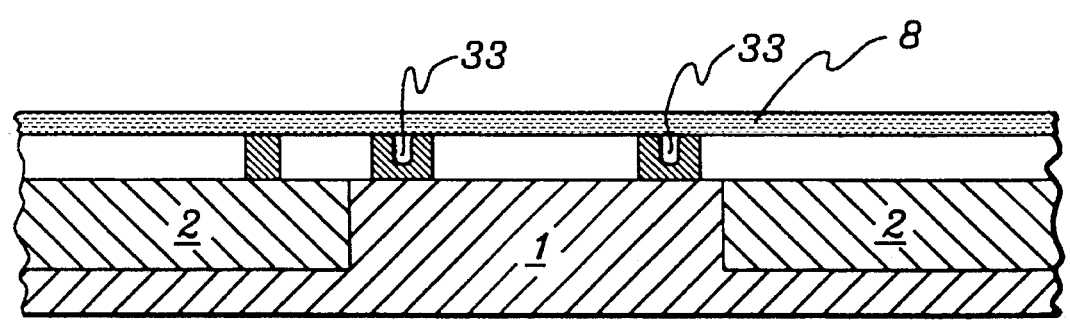
Figure 18:
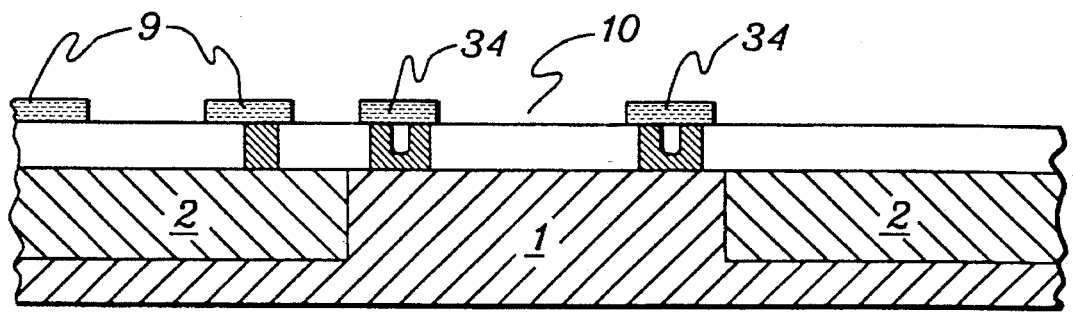

A layer of aluminum or other metallization 8 is deposited by an orientation sensitive process, such as sputtering. By orientation-sensitive is meant that the magnitude of the film growth rate follows the cosine distribution law; that is, the growth rate is proportional to cos α where α is the angle between the vapor stream and the surface normal. Under the conditions of such a deposition, metal is deposited more rapidly at the corners of a groove resulting in growth of the corners more rapidly than the walls or floor. The corners eventually grow together and pinch off a hollow space or cavity 33 within the metal ring 31 and a continuous layer 8 is formed on the top as shown in FIG. 17, paralleling the process shown in FIG. 4 for the first embodiment. In this case, however, the patterning to define the interconnects 9 and the dice lane 10 does not clear the surface over the groove but, rather, leaves a cap 34 0f metal (aluminum) as shown in FIG. 18. This creates a hollow ring that functions in a similar fashion to the groove described above to dissipate the energy of a propagating crack.

Figure 19:
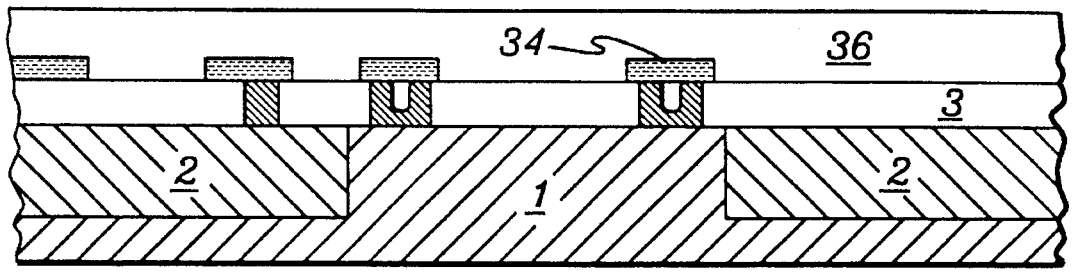
Figure 20:
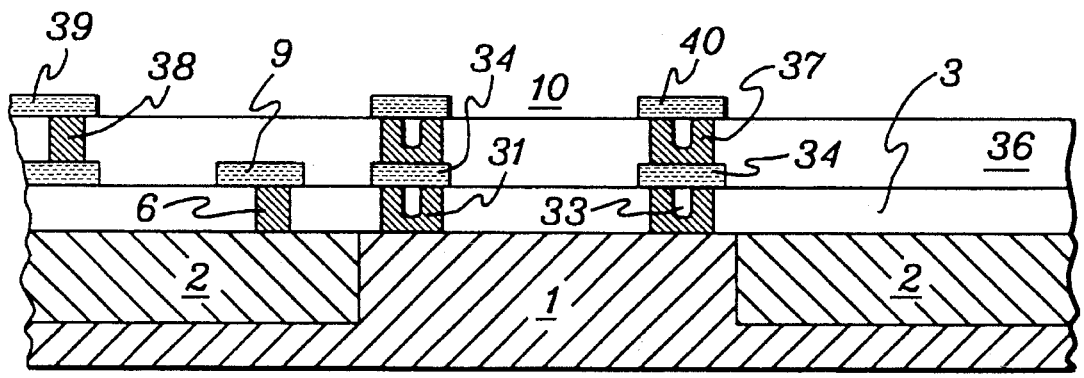

In this embodiment, the process of dielectric deposition, patterning and metallization can be repeated as many times as needed and a stack of crackstops will be created, protecting each layer. FIGS. 19 and 20 illustrate a repetition of the steps of FIGS. 15 to 18 to create a second dielectric layer 36, hollow ring 37, cap 40, interconnect 39 and via 38.

Figure 21:
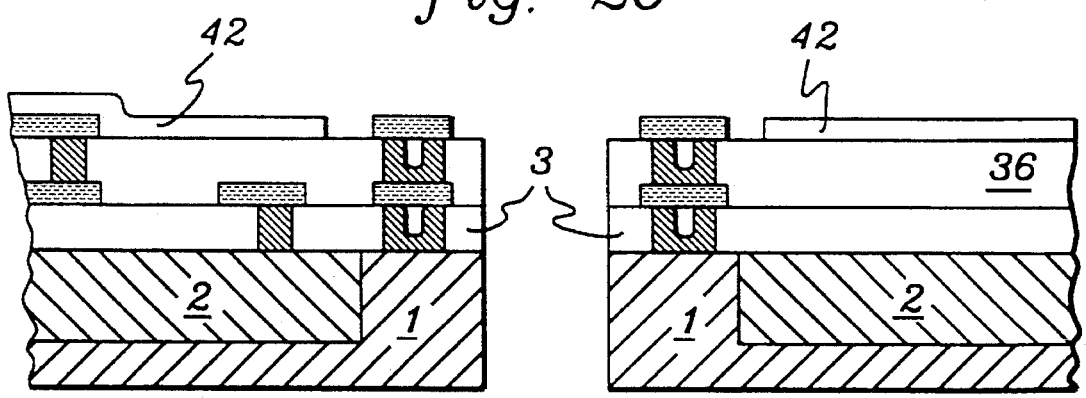
Figure 22:
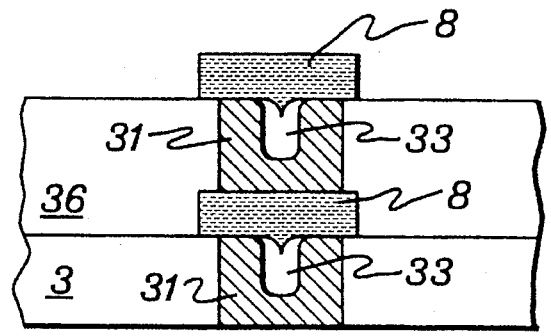
FIG. 22 is an enlarged cross-section of a stacked crackstop according to the third embodiment of the invention.

When the appropriate number of layers have been created, a passivation film 42 is deposited and patterned and the substrate is diced to provide chips as shown in FIG. 21. FIG. 22 shows the stacked crackstops of the third embodiment in larger magnification.

While the invention has been particularly shown and described with reference to preferred embodiments thereof, it will be understood by those skilled in the art that other changes in form and details may be made therein without departing from the spirit and scope of the invention.

I claim:

1. A semiconductor device comprising a semiconductor substrate and a plurality of dielectric layers thereon, said substrate including an active region and each of said dielectric layers containing a continuous hollow metal ring surrounding said substrate active region.

2. A device according to claim 1 wherein each of said hollow metal rings surrounding said active device region is composed of two metal compositions, a first metal composition forming a floor and walls of a cavity and a second metal composition forming a cap of said cavity.

3. A device according to claim 2 wherein said first metal composition is tungsten and said second metal composition is an aluminum alloy.

* * * * *